United States Patent [19]

Zuk

[11] 4,201,927
[45] May 6, 1980

[54] CIRCUIT FOR PRODUCING SEQUENTIALLY SPACED PULSES

[75] Inventor: Borys Zuk, New Hope, Pa.

[73] Assignee: RCA Corporation, New York, N.Y.

[21] Appl. No.: 903,688

[22] Filed: May 8, 1978

[30] Foreign Application Priority Data

May 24, 1977 [GB] United Kingdom ............... 21890/77

[51] Int. Cl.² ........................ H03K 3/286; H03K 5/13
[52] U.S. Cl. .................................. 307/269; 307/247 R; 307/262
[58] Field of Search .................... 307/247 R, 260, 262, 307/269; 328/62

[56] References Cited

U.S. PATENT DOCUMENTS

| | | | |
|---|---|---|---|
| 3,393,367 | 7/1968 | Vallee | 328/62 |
| 3,612,906 | 10/1971 | Kennedy | 307/269 |
| 3,838,297 | 9/1974 | Bardo et al. | 307/260 X |
| 3,866,129 | 2/1975 | Cornelissen | 307/262 X |

Primary Examiner—John S. Heyman
Attorney, Agent, or Firm—H. Christoffersen; Henry I. Schanzer

[57] ABSTRACT

First, second and third set-reset flip-flops (FFs), reset to an initial stable state, are interconnected such that the second FF can change state only after the first FF has changed state and the third FF can change state only after the second FF has changed state. Outputs of the first and second FFs are combined to enable the production of a first output pulse and outputs of the second and third FFs are combined to enable the production of a second output pulse consecutive to, and non-overlapping with, the first output pulse.

5 Claims, 5 Drawing Figures

CIRCUIT FOR PRODUCING SEQUENTIALLY SPACED PULSES

This invention relates to a circuit for generating sequentially spaced pulses. Such circuits may be used, for example, in a memory array employing Metal Nitride Oxide Semiconductor (MNOS) devices where it is required that information contained in selected portion of the memory be erased before writing new information into the selected portions. To effectuate the erase and subsequent write functions, pulses have to be generated which have a desired sequence and which are of relatively long duration (e.g., 10 milliseconds). Furthermore, it is important that the circuit(s) producing the erase and write pulses have a high level of noise immunity to prevent transients and noise signals from initiating undesired erase or write signals or aborting an ongoing erase or write cycle.

The present invention is embodied, for example, in a circuit that includes first, second and third bistable circuit elements, such as set-reset flip flops (FFs), each having a set input, a reset input and at least one "true" and one "false" (i.e., "complement") output. Initially, before each sequence of output pulses an initializing circuit applies reset signals to the reset inputs of the first, second, and third bistable circuit elements, which is then removed, to leave each in a first of its two stable states. The first bistable element is set to its second stable state in response to an input signal of a first binary value being applied to its set input. An output of the first bistable is coupled to the set-input of the second bistable for setting the latter to its second stable state when the input signal is of second binary value and the first bistable is set to its second stable state. An output of the second bistable is coupled to the set input of the third bistable for setting the latter to its second stable state when the input signal is of the first binary value and the second bistable is set to its second stable state. Outputs of the first and second bistable circuits are combined (e.g., ANDED) to produce a first output pulse. Outputs of the second and third bistable circuits are combined to produce a second output pulse subsequent to, and not overlapping with, the first output pulse.

The invention is discussed in greater detail below and is shown in the following drawings of which:

In the description to follow, the circuits are illustrated using bipolar transistors manufactured in accordance with known integrated injection logic (I²L) circuit techniques. This is done by way of illustration only and it should be appreciated that other transistor types and circuit arrangements could be used to perform the functions discussed below.

The collectors and bases of each transistor are identified by the letter "c" and "b", respectively, preceded by the specific number of their transistor. Each collector of a multi-collector transistor is denoted by the number of the transistor followed by the letter c and a particular numeral (1, 2, or 3) identifying each specific collector.

Also, the blocks in the various FIGS. represent electrical circuits which receive inputs representing binary digits (bit) and which produce one or more outputs representing bits. For purposes of the present discussion, it is assumed, arbitrarily, that a relatively high voltage level also referred to as "HIGH", represents the binary "1" state and a relatively LOW level also referred to as "LOW" represents the binary "0" state. For the sake of brevity in the explanation which follows, it is sometimes stated that a circuit point is a low ("0") or a high ("1") rather than stating that a signal representing a low or a high is applied to, or produced by or at, the circuit point.

Figure 1:
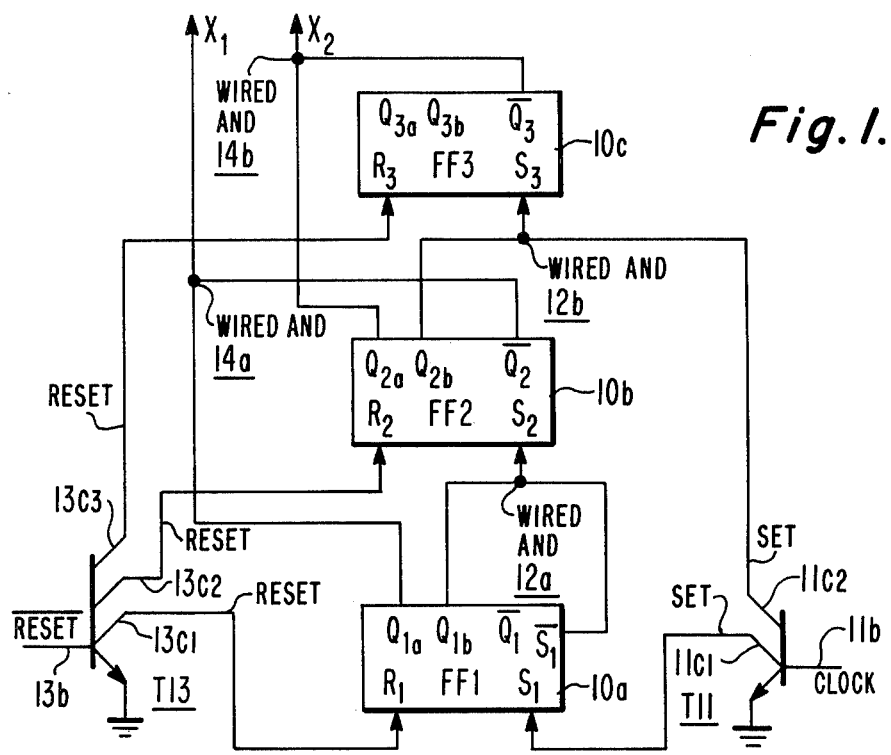
FIG. 1 is a partial-block diagram, partial-schematic diagram, of an Integrated Injection Logic (I²L) type circuit embodying the invention.
Figure 2:
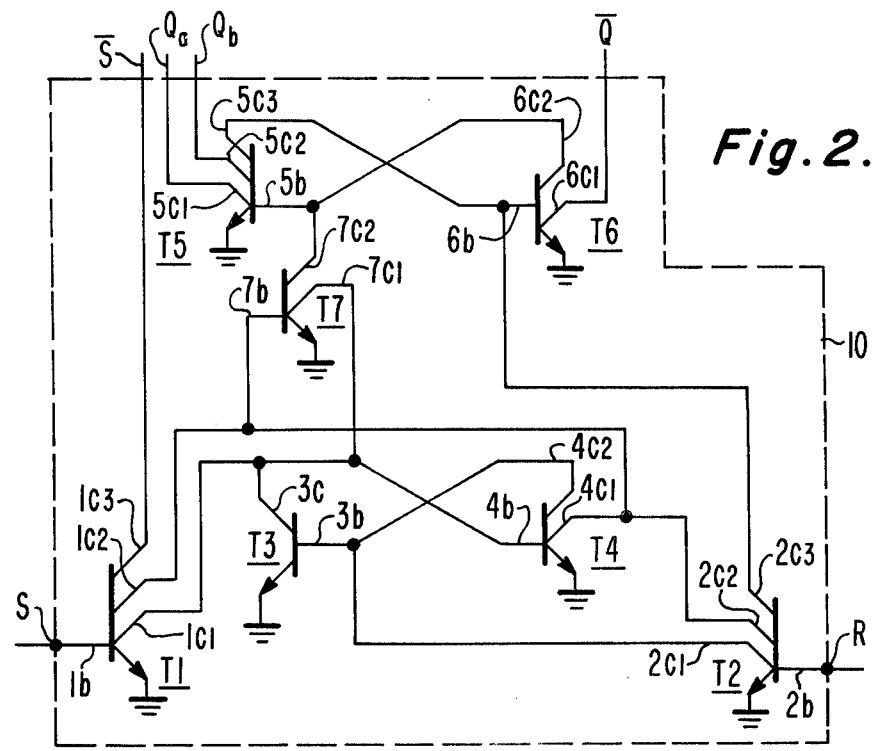
FIG. 2 is a schematic diagram of an I²L flip-flop which may be used in the circuit of FIG. 1.

The circuit of FIG. 1 includes three set-reset (S-R) flip-flops, FF1, FF2, FF3, each of which may be of the type shown schematically in FIG. 2. The FF of FIG. 2 includes: (a) multiple-collector input transistors T1 and T2 whose bases, $1b$ and $2b$, respectively, are connected to the set (S) and reset (R) inputs, respectively; (b) an input latch circuit comprised of cross-coupled transistors T3 and T4; (c) an output latch circuit comprised of cross-coupled transistors T5 and T6; and (d) an intermediate latch comprised of transistor T7 cross-coupled with T4.

The emitters of all the transistors are returned to ground potential. The collectors $2c1$, $2c2$, and $2c3$ of T2 are connected to bases $3b$, $7b$ and $6b$, respectively. The collectors $1c1$ and $1c2$ of T1 are connected to bases $4b$, and $7b$, respectively, and collector $1c3$ is used to generate the complement, $\overline{S}$, of the Set input. The collector $3c$ is connected to the base $4b$ of T4 and the collector $4c2$ is connected to the base, $3b$, of T3 forming the input latch. The collector $4c1$ is connected to the base $7b$ of T7 and the collector $7c1$ is connected to the base $4b$ of T4 forming the intermediate latch. The collector $7c2$ is connected to the base $5b$, of T5 whereby, when T7 is turned on, it turns off T5 and causes T6 to turn on. The collector $6c2$ is connected to the base of T5 and the collector $5c3$ is connected to the base of T6 forming the output latch. At collectors $5c1$ and $5c2$ are produced outputs $Qa$ and $Qb$, which are arbitrarily defined as the "true" outputs of the FF. At the collector $6c1$ is produced the output $\overline{Q}$ which is arbitrarily defined as the "false" or "COMPLEMENT" output of the FF.

Figure 3:
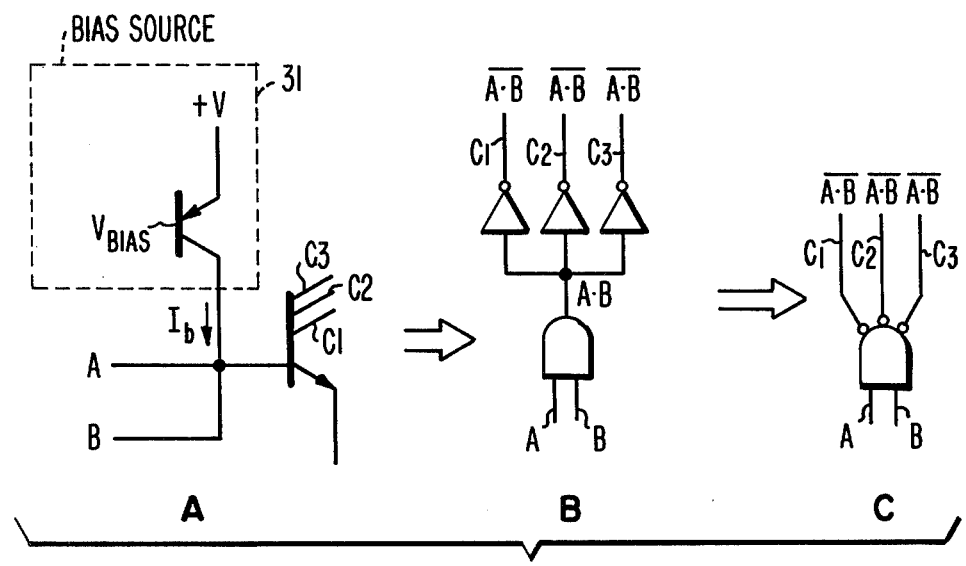
FIG. 3A is a schematic diagram of a two-input logic gate of a type suitable for applying bias to the base of each NPN transistor in the circuits of FIGS. 1 and 2.
FIGS. 3B and 3C are equivalent logic block diagrams of the circuit of FIG. 3A.

Each transistor shown in FIGS. 1 and 2 is of NPN conductivity type and has a bias source 31 of the type shown in FIG. 3A connected to its base. [For clarity of the drawings the bias source 31 is omitted from the FIGURES, other than 3A, since its presence in I²L circuit is known.] The bias source includes a lateral PNP transistor whose emitter is connected to a point of positive operating ($V_{BIAS}$), and whose collector is connected to the base of an NPN transistor supplying base current thereto.

Pertinent operating features of the FF shown in FIG. 2 are discussed below. The "RESET" condition of the FF is, arbitrarily, defined as $\overline{Q}$=HIGH and $Qa=Qb=$LOW. The Reset condition is produced when R is HIGH. R=HIGH dominates and resets $\overline{Q}$ to the high level and $Qa$ and $Qb$ to the low level regardless of whether S is HIGH or LOW. When R=HIGH, T2 is on and $2c1=2c2=2c3=$LOW. $2c1=$LOW turns off T3 and causes 3b and 4c2 to go LOW. 2c2=LOW turns off T7 and causes 4c1, 7b and 1c2 to go LOW. 2c3=LOW turns off T6 and causes 6b and 5c3 to go LOW. 7b=LOW allows 7c2 and 5b to go HIGH turning on T5. Since T6 is off, 6c1 ($\overline{Q}$) and 6c2 go HIGH while Qa and Qb are LOW.

When R is HIGH and S is HIGH, T1 and T2 are on and the state of the input latch is indeterminate since the bases and collectors of T3 and T4 are held low. However, T7 and T6 are turned OFF while T5 is turned ON, and therefore $Qa=Qb=$LOW and $\overline{Q}=$HIGH.

The "SET" condition of the FF is defined, arbitrarily as $Qa=Qb=$HIGH and $\overline{Q}=$LOW. When R is LOW, S=LOW can set the FF to $\overline{Q}=$LOW and $Qa=Qb=$HIGH. But, as explained below, following a transition of R from HIGH to LOW and with R continuing low, S must first make a transition from HIGH to LOW before S=LOW can set the FF. Once the FF is set it remains set regardless of the transitions in the levels at S, so long as R continues to remain LOW.

When R is LOW the levels at 2c1, 2c2 and 2c3 can go HIGH. If S was LOW prior to R going LOW and remained LOW, then the input latch remains in its previous state with T3-ON and T4-OFF such that 4c1 and 7b are LOW. This maintains the output latch in the "RESET" condition such that $Qa=Qb=$LOW and $\overline{Q}=$HIGH. If, on the other hand, S is, or goes HIGH after R goes LOW, T1 is ON and the outputs at 1c1, 1c2 and 1c3 go LOW. 1c3 going LOW turns off T4 by causing 4b to go LOW. This enables 4c2 and 3b to go HIGH turning on T3 and causing 3c to go LOW. Thus, the effect of S=HIGH (with R=LOW) is to turn on T3 and turn off T4 (i.e., it changes the state of the input latch) with T7 still turned OFF due to 1c2 LOW and the FF remaining in the reset condition.

If and when S makes a transition from HIGH to LOW, subsequent to R going and staying LOW, T1 and T2 are turned off with the input latch in the condition of T3-ON and T4-OFF. Since T1 and T2 are OFF, the three inputs (4c1, 2c2 and 1c2) to 7b are now HIGH. Consequently, T7 is turned on, 7c2 goes LOW pulling 5b and 6c2 LOW. This causes the output latch comprised of T5 and T6 to go to the set state which $Qa=Qb=$HIGH and $\overline{Q}=$LOW.

The intermediate latch formed by T7 and T4 is particularly useful when R and S are HIGH and then, simultaneously, go LOW. T7 turns on first causing T4 to turn off and the FF to be driven to the set condition. Thus, any transition of the S signal from HIGH to LOW occurring simultaneously with, or subsequent to, R going or being low sets the FF, and once set the FF remains set until reset by R going HIGH.

The circuit of FIG. 2 may be redrawn in terms of the logic symbols shown in FIGS. 3B and 3C.

FIG. 3B shows that the NPN transistor of FIG. 3A having 2 inputs (A,B) and multiple collector outputs may be represented by a 2 input AND gate with each collector output represented by an inverter connected to the output of the AND gate.

FIG. 3C shows that the circuit of FIG. 3B may be represented by a 2 input NAND gate with multiple outputs.

Figure 4:
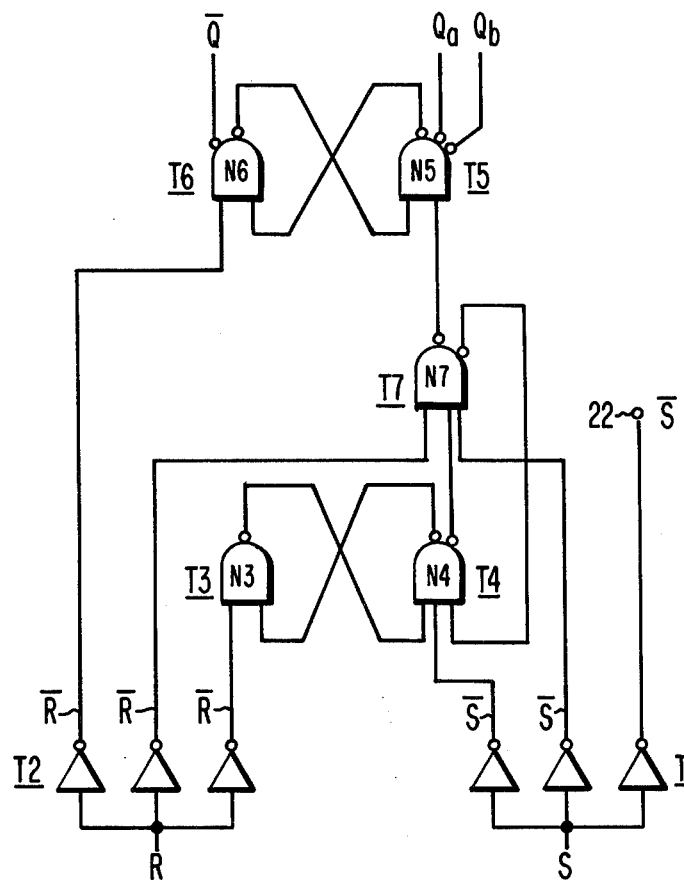
FIG. 4 is a logic block diagram equivalent to the schematic of FIG. 2.

Using the equivalent diagrams shown in FIGS. 3B and 3C, the schematic diagram of the FF of FIG. 2 may be represented as shown in FIG. 4. Transistors T1 and T2 are represented by inverters. Transistor T3 is represented by a two-input NAND gate, N3, and transistor T4 is represented by a three-input two-output NAND gate, N4. Gates N3 and N4 are cross-coupled to form the input (or MASTER) latch. Transistor T7 is represented by a three input two-output NAND gate which functions to transfer the information from the input latch to the output (or SLAVE) latch. The three inputs to T7 are $\overline{R}$, $\overline{S}$ and the output of T4. Transistor T5 is represented as a two-input three output NAND gate, N5, and T6 is a two-input, two-output NAND gate N6. Gates N5 and N6 are cross-coupled to form the output latch.

The structure and operation of the circuit of FIG. 1 will now be discussed. A clock signal generated by a circuit (not shown) is applied to the base 11b of an inverting transistor T11 and a $\overline{\text{RESET}}$ signal is applied to the base 13b of an inverting transistor T13. The clock signal may be a command or input signal initiating a read/write cycle or an erase-write cycle which is inhibited when $\overline{\text{RESET}}$ is LOW.

RESET signals which are the complement of $\overline{\text{RESET}}$ are produced at the collectors 13c1, 13c2 and 13c3 which are connected to the reset inputs R1, R2 and R3, respectively, of FF1, FF2 and FF3, respectively. SET signals (S) which are the complement of the clock signal are produced at the collectors 11c1, 11c2 which are connected to the set inputs S1 and S3, respectively, of FF1 and FF2. The $\overline{S1}$ and Q1 outputs of FF1 are connected together (logically "ANDED") and applied to the set input S2 of FF2. The Q2b output of FF2 and the output at collector 11c2 are connected together ("ANDED") and applied to the set input S3 of FF3. The outputs Q1a of FF1 and $\overline{Q2}$ of FF2 are connected together (ANDED) to produce a unique output pulse X2.

Figure 5:
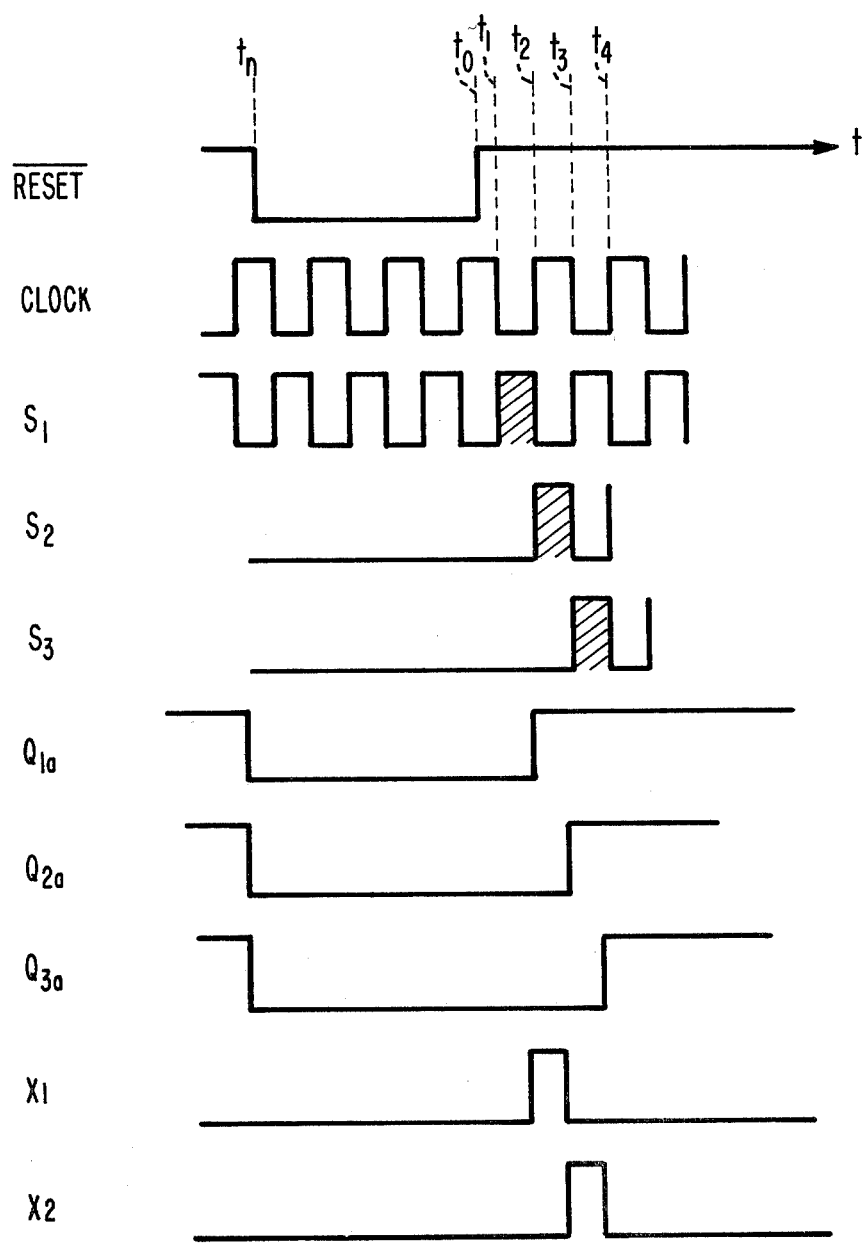
FIG. 5 is a drawing of waveforms present in the circuit of FIG. 1.

The operation of the circuit of FIG. 1 may be more easily explained with reference to the waveform diagram of FIG. 5 keeping in mind the operation of the FFs described above. Assume, for example, that at some time $t_n$, the $\overline{\text{RESET}}$ input to transistor 13 goes from HIGH to LOW. This causes the R inputs to FF1, FF2 and FF3 to go HIGH which resets (i.e., INITIALIZES) the flip flops to their "RESET" condition. The "false" outputs (COMPLEMENTS) $\overline{Q1}=\overline{Q2}=\overline{Q3}$ are then HIGH and the "true" outputs $Q1a=Q1b,=Q2a=Q2b,=Q3a=Q3b=$LOW. Consequently, X1 which is produced by "ANDING" the outputs at Q1a and $\overline{Q2}$ ($X1=Q1a\cdot\overline{Q2}$) is LOW, and X2 which is produced by "ANDING" the outputs at Q2a and $\overline{Q3}$ ($X2=Q2a\cdot\overline{Q3}$) is also LOW.

Assume now that, at some time $t_0$, $\overline{\text{RESET}}$ goes from LOW to HIGH (and remains HIGH for the remainder of this description) turning on T13 and driving the reset inputs $R1=R2=R3=$LOW. Assume further that this occurs when the clock is HIGH whereby the signals to the set inputs S1 and S3 are LOW because 11c1 and 11c2 are LOW and the signal to the set input S2 is low because Q1b is LOW. For this condition of $\overline{\text{RESET}}$ and clock FF1, FF2 and FF3 remain in their reset condition, as explained above.

At time $t_1$ the clock makes a transition from HIGH to LOW causing S1 to go HIGH. However S2 remains low because $\overline{S1}$ and Q1b are both low and S3 remains low because Q2b remains LOW. Consequently, FF1, FF2 and FF3 remain in their RESET condition.

At time $t_2$ the clock makes a transition from LOW to HIGH causing S1 to go from HIGH to LOW. Upon this transition at its set input (with R1 LOW) FF1 changes state and goes to its set state in which $Q1a=Q1b=$HIGH and $\overline{Q1}=$LOW. $\overline{S1}$ is HIGH (since S1 is LOW) and Q1b is now HIGH, hence S2 goes HIGH, but FF2 remains in its RESET state. Since Q2b and 11c2 are low, S3 remains low and FF3 also remains in its RESET state. Since Q1a is now HIGH and since $\overline{Q2}$ is HIGH the signal at X1 goes from LOW to HIGH.

At time t3, the clock makes a transition from HIGH to LOW. S1 goes from LOW to HIGH but with R1 remaining LOW FF1 remains in its set state. S2 goes from HIGH to LOW and FF2 switches to its set state in which Q2a=Q2b=HIGH and $\overline{Q2}$=LOW. $\overline{Q2}$ going low causes X1 to go from HIGH to LOW thus terminating pulse X1 at time t3. Concurrently, since Q2b and 11c2 are HIGH, S3 goes HIGH but FF3 remains in its RESET state with $\overline{Q3}$=HIGH. Since Q2a is now HIGH and since $\overline{Q3}$ is HIGH, X2 goes from LOW to HIGH.

At time t4 the clock makes a transition from LOW to HIGH and S3 goes from HIGH to LOW causing FF3 to change to its SET state in which Q3a=Q3b=HIGH and $\overline{Q3}$=LOW. $\overline{Q3}$ going LOW causes X2 to go LOW terminating pulse X2 at time t4.

Thus, so long as $\overline{RESET}$ remains HIGH, the flip-flops are sequentially placed in their set states and non-overlapping consecutive pulses are produced.

It should be appreciated that the direct coupled (d.c.) connection of Q1a and $\overline{Q2}$ and the d.c. connection of Q2a and $\overline{Q3}$ enables the formation of the AND (wired AND) function without the need of additional components.

The teachings of the present invention are applicable where one wishes to generate a sequence of consecutive, non-overlapping output pulses, N in number, even when N is made larger than two. One adds an extra flip-flop to the FIG. 1 circuit for each integer by which N exceeds two, each reset similarly to flip-flops FF1, FF2, FF3. The flip-flops with even ordinal numbers— e.g., a fourth flip-flop FF4—are wired to be set when the flip-flop with ordinal number one lower—continuing the example, FF3—has been set and $\overline{S_1}$ next goes LOW after going HIGH. The flip-flops with odd ordinal numbers greater than one—e.g., a fifth flip-flop FF—are wired to be set when the flip-flop with ordinal number one lower—continuing the example, FF4—has been set and $S_1$ next goes LOW after going HIGH. Further AND gates are connected to the flip-flops to provide additional respective output pulses, as desired.

By proper connection of the AND gates, the spacing between pulses can be adjusted. One may combine the output pulses on separate output lines to obtain a train of output pulses on a single line, of course, if such be desired.

The functions of the individual elements and the circuit operation may be summarized as follows. Transistor T13 having outputs coupled to respective ones of the bistable circuits FF1, FF2 and FF3 and having an input to which the reset signal is applied operates as an initializing circuit for placing each bistable circuit in a first of its two stable states prior to the beginning of each sequence of pulses to be produced at X1 and X2.

Transistor T11 and gates 12a and 12b (and transistor T1 in FF1) operate as a control circuit having a clock input connection (at 11b) for receiving a clock input signal, the outputs of which are arranged for placing the first, second and third bistable circuits in their second stable states (SET) consecutively in response to alternate transitions of the clock signal subsequent to initialization of the bistable circuits.

Output circuitry comprises gates 14a and 14b. Gate 14a having inputs coupled to the outputs (Q1a, $\overline{Q2}$) of the first and second bistable circuits (FF1, FF2) produces a first output signal (X1) in response to the first and second bistable circuits being in opposite ones of their stable states. Gate 14b having inputs coupled to the outputs of the second and third bistable circuits (FF2, FF3) produce a second output (X2) responsive to the second and third bistable circuits being in opposite states.

What is claimed is:

1. A circuit for generating two consecutive, non-overlapping pulses, comprising:

first, second, and third bistable circuit elements, each bistable element having a set input for setting the element to one stable state, a reset input for setting the element to another stable state, and true and false outputs; each bistable element being of the type which is set to said one stable state when the signal at its set input makes a transition from a first binary value to a second binary value subsequent to the signal at its reset input having made a transition to said second binary value; each bistable circuit being initially in a stable state;

means for applying an input signal of one binary value to said set input of said first bistable element for setting it to its second stable state, other than its initial state;

means, responsive to said input signal representing a bit of the other than said one binary value and to said first bistable circuit being in its second stable state, coupled to the set input of said second bistable circuit, for setting it to its second, other than initial, stable state;

means, responsive to said input signal representing a bit of said one binary value and to said second bistable circuit being in its second stable state, coupled to the set input of said third bistable circuit for setting it to its second other than initial, stable state;

means for combining outputs of said first and second bistable circuits for producing a first pulse; and means for combining outputs of said second and third bistable circuits for producing a second pulse consecutive to, and non-overlapping with, said first pulse.

2. The combination as claimed in claim 1 further including means for applying the same value of reset signal to the reset inputs of said first, second, and third bistable circuit elements.

3. The combination as claimed in claim 2 wherein said means for combining outputs of said first and second bistable circuits includes a direct current connection between a true output of said first bistable circuit and a false output of said second bistable circuit; and wherein said means for combining outputs of said second and third bistable circuits includes a direct current connection between a true output of said second bistable circuit and a false output of said third bistable circuit.

4. The combination as claimed in claim 1 wherein each one of said bistable circuit elements includes an input latch, an output latch and an intermediate circuit for selectively coupling an output of the input latch to an input of the output latch.

5. The combination as claimed in claim 4 wherein said input latch includes first and second cross coupled bipolar transistors;

wherein said output latch includes third and fourth cross coupled bipolar transistors; and wherein said intermediate circuit includes a fifth transistor connected at its base to the collector of one of said first and second transistors and connected at its collector to the base of one of said third and fourth transistors.

* * * * *

UNITED STATES PATENT AND TRADEMARK OFFICE
CERTIFICATE OF CORRECTION

PATENT NO. : 4,201,927

DATED : May 6, 1980

INVENTOR(S) : Borys Zuk

It is certified that error appears in the above-identified patent and that said Letters Patent is hereby corrected as shown below:

Col. 2, line 58 after "operating" insert --- potential +V, whose base is connected to a bias potential ---.

Col. 3, line 29 "1c3" second occurrence should be --- 1c1 ---.

Signed and Sealed this

Twenty-sixth Day of August 1980

[SEAL]

Attest:

SIDNEY A. DIAMOND

Attesting Officer  Commissioner of Patents and Trademarks